(12) United States Patent
Dearden

(10) Patent No.: US 8,781,541 B2
(45) Date of Patent: *Jul. 15, 2014

(54) ELASTOMERIC BACK WITH RAILS FOR MOBILE DEVICE

(71) Applicant: BlackBerry Limited, Waterloo (CA)

(72) Inventor: Jonathan Joshua Dearden, Waterloo (CA)

(73) Assignee: BlackBerry Limited, Waterloo (CA)

( * ) Notice: Subject to any disclaimer, the term of this patent is extended or adjusted under 35 U.S.C. 154(b) by 0 days.

This patent is subject to a terminal disclaimer.

(21) Appl. No.: 14/049,313

(22) Filed: Oct. 9, 2013

(65) Prior Publication Data

US 2014/0045555 A1 Feb. 13, 2014

Related U.S. Application Data

(63) Continuation of application No. 12/328,946, filed on Dec. 5, 2008, now Pat. No. 8,583,195.

(51) Int. Cl.
| | | |
|---|---|---|
| *H04M 1/00* | (2006.01) | |
| *H04M 1/04* | (2006.01) | |
| *A45F 5/00* | (2006.01) | |
| *H04M 1/02* | (2006.01) | |
| *H04M 1/725* | (2006.01) | |
| *H05K 5/02* | (2006.01) | |
| *H04W 52/02* | (2009.01) | |
| *A45F 5/02* | (2006.01) | |
| *A45C 11/00* | (2006.01) | |

(52) U.S. Cl.
CPC .. *H04M 1/04* (2013.01); *A45F 5/02* (2013.01); *A45F 2200/0516* (2013.01); *A45C 2011/002* (2013.01); *A45F 5/00* (2013.01); *H04M 1/0279* (2013.01); *H04M 1/72527* (2013.01); *H05K 5/0217* (2013.01); *H04W 52/0251* (2013.01)

USPC .... 455/575.4; 455/90.3; 455/573; 455/575.1; 455/575.6; 455/575.8

(58) Field of Classification Search
USPC ............ 455/575.1, 575.4, 575.6, 575.8, 90.3; 224/196, 663; 361/679.42
See application file for complete search history.

(56) References Cited

U.S. PATENT DOCUMENTS

| | | | |
|---|---|---|---|
| 4,299,344 | A | 11/1981 | Yamashita et al. |
| 5,383,091 | A | 1/1995 | Snell |

(Continued)

FOREIGN PATENT DOCUMENTS

| | | |
|---|---|---|
| EP | 0743761 A2 | 11/1996 |
| EP | 1301011 A2 | 9/2003 |

(Continued)

OTHER PUBLICATIONS

EPO: Communication pursuant to Article 94(3) EPC, Application No. 08 170 882.8-2414, Jul. 5, 2011 (6 pages).

(Continued)

*Primary Examiner* — Amancio Gonzalez
(74) *Attorney, Agent, or Firm* — Jones Day

(57) ABSTRACT

A mobile device has a front face and a back face opposite the front face. The back face includes an elastomeric layer. A pair of longitudinal sides are coupled to the front face and back face, and a pair of latitudinal sides are also coupled to the front face and back face. The back face or the longitudinal sides define a recessed slot extending along a longitudinal length of the back face or longitudinal sides, respectively. The recessed slot defines an open end at at least one of the latitudinal sides. The recessed slot has a recessed slot surface that has a low-friction material. A holster includes a pocket defining an open top end configured to receive the mobile device. A rail extends longitudinally along an interior side of the pocket. The rail is configured to correspond with and slidably engage the slot on the mobile device.

19 Claims, 6 Drawing Sheets

(56) References Cited

U.S. PATENT DOCUMENTS

| | | | |
|---|---|---|---|
| 5,542,105 | A | 7/1996 | Finch et al. |
| 5,666,273 | A | 9/1997 | Kurchart |
| 5,748,454 | A | 5/1998 | Nichols et al. |
| 6,441,872 | B1 | 8/2002 | Ho |
| 6,999,805 | B2 | 2/2006 | Gartrell et al. |
| 7,012,805 | B2 | 3/2006 | Shah et al. |
| 7,072,699 | B2 | 7/2006 | Eiden |
| 7,092,680 | B2 | 8/2006 | Lee et al. |
| 8,583,195 | B2 * | 11/2013 | Dearden ............ 455/575.4 |
| 2006/0116183 | A1 | 6/2006 | Infanti |
| 2007/0270193 | A1 | 11/2007 | Hsieh |

FOREIGN PATENT DOCUMENTS

| | | |
|---|---|---|
| EP | 1301011 A3 | 3/2009 |
| JP | 11-342022 | 12/1999 |
| WO | 01/61875 A1 | 8/2001 |

OTHER PUBLICATIONS

EPO: Communication (extended European search report) issued Jun. 5, 2009 for European patent application No. 08170882-2414 (15 pages).

Motorola Motorola PEBL, Images for Motorola PEBL: http://www.motorola.com/motoinfo/product/images.jsp?globalObjectid=87, retrieved on Dec. 3, 2008.

Motorola Motorola RAZR V3x, Images for Motorola RAZR V3x; http://www.motorola.com/motoinfo/product/images.jsp?globalObjectid=95, retrieved on Dec. 3, 2008.

Sprint, i530 Guides & Tutorials; http://www.nextel.com/en/support/guides/phones/i530.shtml, retrieved on Dec. 3, 2008.

Motodev>Products>Handsets>i605; http://www.developer.motorola.com/products/handsets/i605,retrieved on Dec. 3, 2008.

Triton Series, Magellan(R) Triton(TM) 2000—North America; http://www.magellangps.com/products/product.asp?seGID=425, retrieved on Dec. 3, 2008.

Magellan Professional GPS, GPS/GNSS Solutions; http://pro.magellangps.com/en/solutions/mobilemap/, retrieved on Dec. 3, 2008.

Seidio Crystal/Rubberized/Skin Case Holster for BlackBerry Curve-BBerry; http://www.bberry.com/seidio-crystal-rubberized-skin-case-holster/4A24A2938.htm, retrieved on Dec. 3, 2008.

HTC-Touch Phone, PDA Phone, Smartphone, Mobile Computer: Products-HTC S710: Overview;http://www.htc.com/europe/products/s710/overview.html, retrieved on Dec. 3, 2008.

T-Mobile Dash(TM) phone details from T-Mobile; http://www.t-mobile.com/shop/Phones/Details.aspx?device=fl64419f-eee9-4cf6-a1b . . . ,retrieved on Dec. 3, 2008.

EPO: Communication (partial European search report) issued Mar. 17, 2009 for European patent application No. 08170882.8-2414 (6 pages).

CIPO: Requisition (office action) for Application No. 2685950 dated Sep. 14, 2011 (4 pages).

* cited by examiner

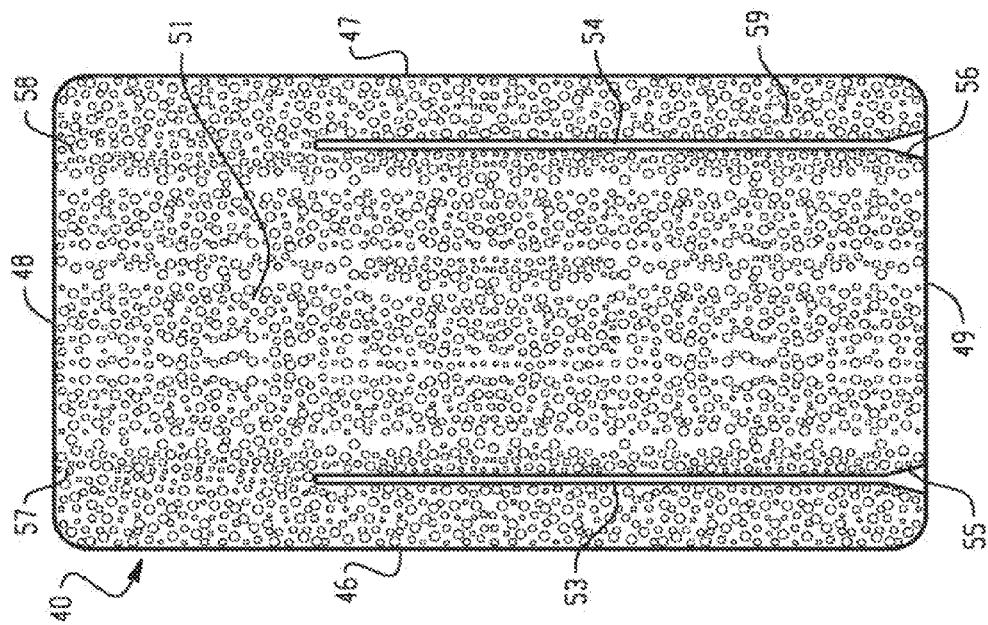
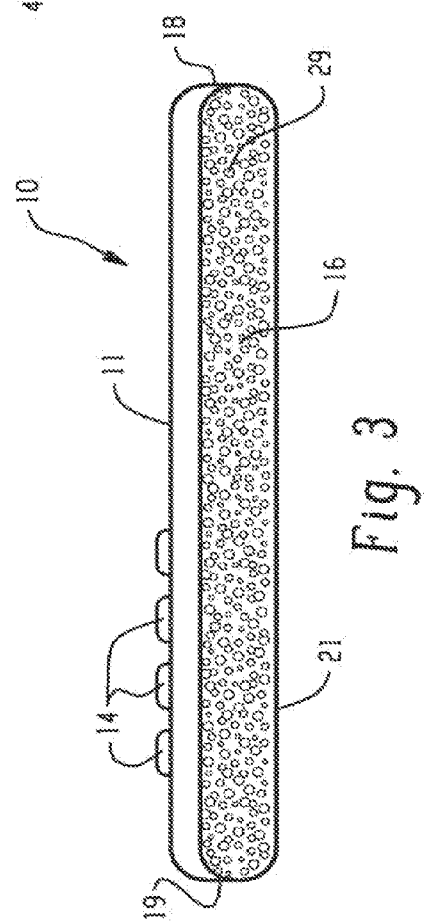
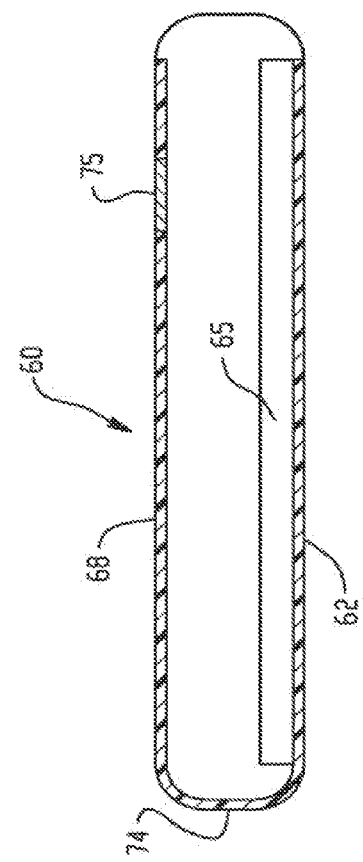

ELASTOMERIC BACK WITH RAILS FOR MOBILE DEVICE

CROSS-REFERENCE TO RELATED APPLICATION

This is a continuation of U.S. application Ser. No. 12/328,946, filed Dec. 5, 2008, hereby incorporated herein by reference.

FIELD

The technology described in this patent document relates generally to the field of handheld mobile devices.

BACKGROUND

Handheld mobile devices, such as smart phones and cellular phones, are typically enclosed in hard cases composed of hard materials that present a low-friction surface. This type of enclosure provides impact resistance and durability; however, such smooth-surfaced, low-friction materials have some drawbacks. For example, a mobile device with a hard, slippery, plastic case will readily slide across most surfaces, such as a car dashboard or seat. This can cause the mobile device to fall out of reach, and it can be especially dangerous to retrieve while driving. Furthermore, a slippery surface can contribute to the mobile device being dropped and broken.

Rubber surfaces have been used to partially cover mobile devices. However, the high-friction properties of rubber enclosures that provide a superior gripping feature also greatly inhibit the ability of the user to put the device in a holster, since the high-friction rubber resists being inserted and removed from the holster.

BRIEF DESCRIPTION OF THE DRAWINGS

FIG. 3 is a side view of the example mobile device;
FIG. 4 is a back view of a second example mobile device;
FIG. 5 is a side cross-sectional view of an example mobile device holster.

DETAILED DESCRIPTION

Example mobile devices with a high-friction surface and a low-friction recessed slot are described herein. Example holsters are also described herein that include a rail with a low-friction surface that is configured to slidably engage the recessed slot of an example mobile device. These example mobile devices provide the benefits of a high-friction covering while overcoming the challenge of using the mobile device in conjunction with a holster.

Figure 1:
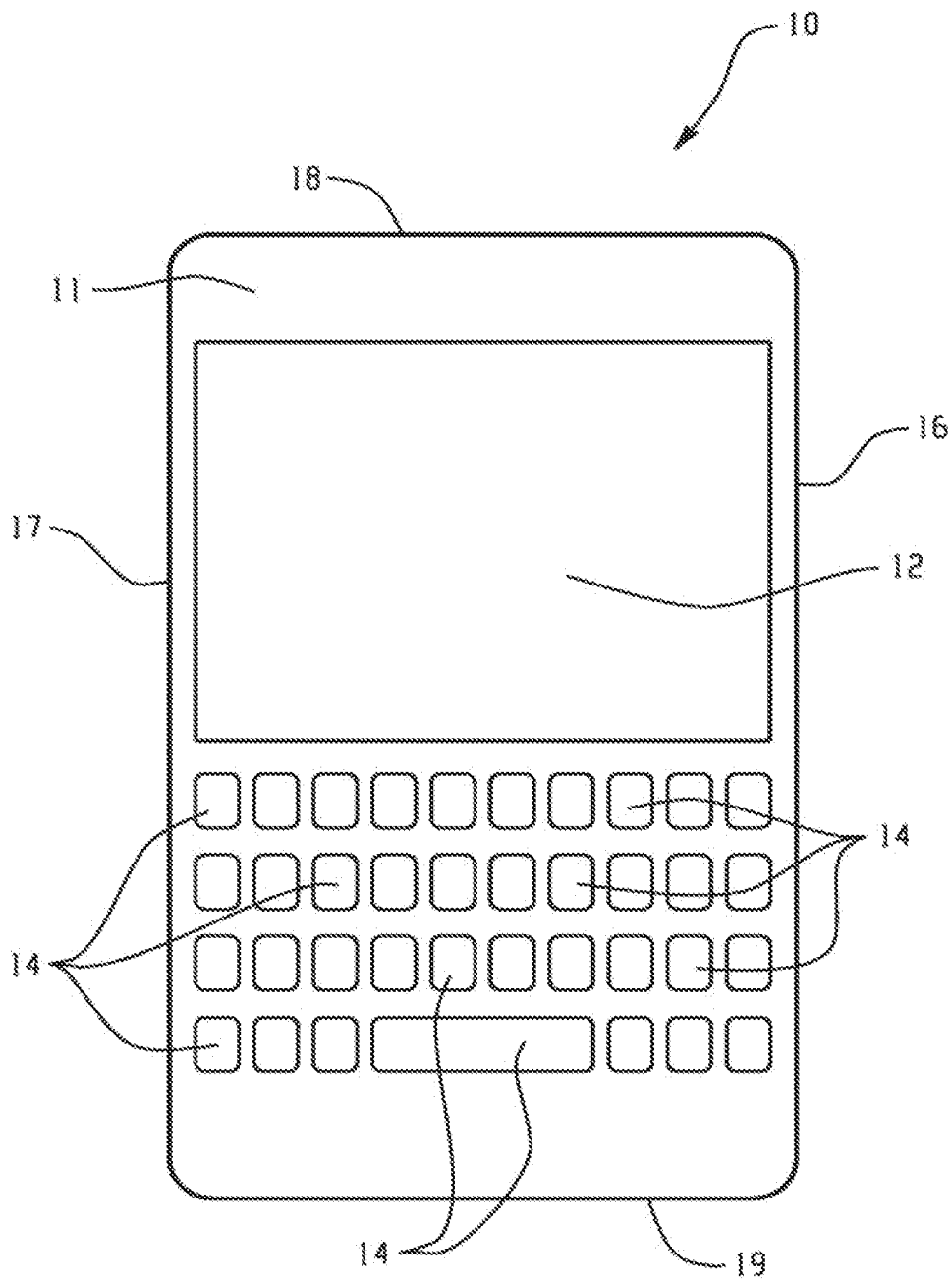
FIG. 1 is a front view of an example mobile device.

FIG. 1 shows an example mobile device 10. The front face 11 includes a display 12 and keys 14. The keys 14 in this example are arranged as a QWERTY keyboard. The front face 11 is circumscribed by a pair of longitudinal sides 16, 17, and a pair of latitudinal sides 18, 19.

Figure 2A:
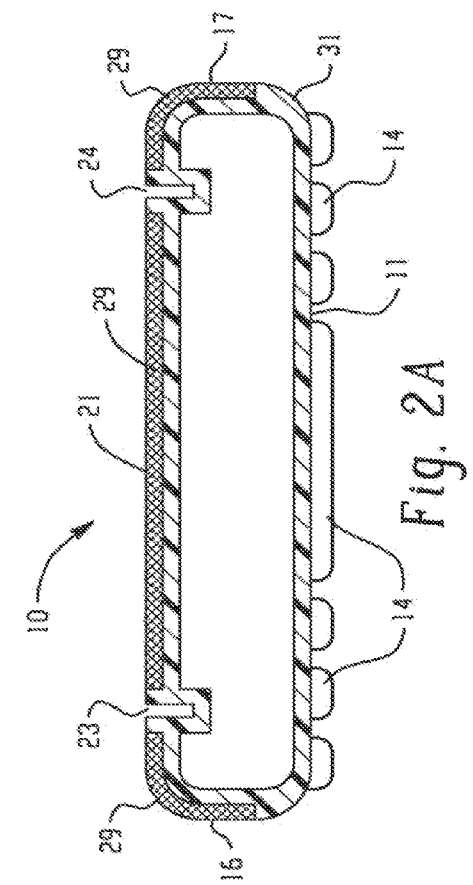
FIG. 2A is a cross-sectional view of the example mobile device.
Figure 2B:
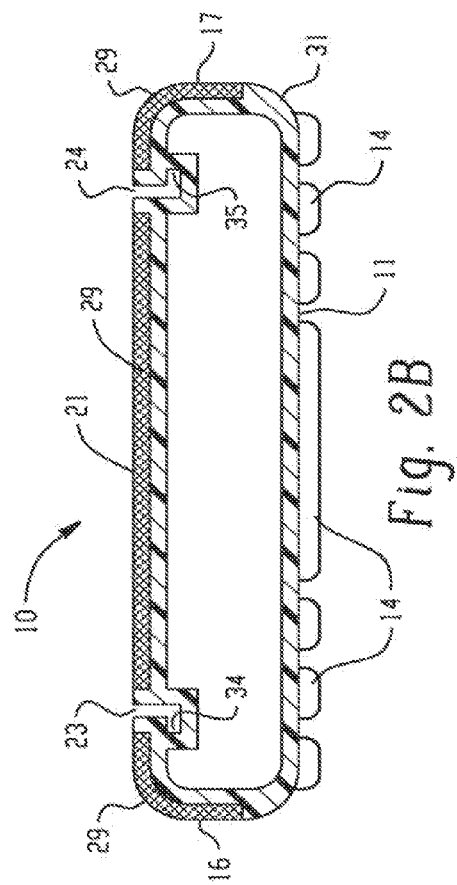
FIG. 2B is a cross-sectional view of the example mobile device with L-shaped recessed slots.
Figure 2:
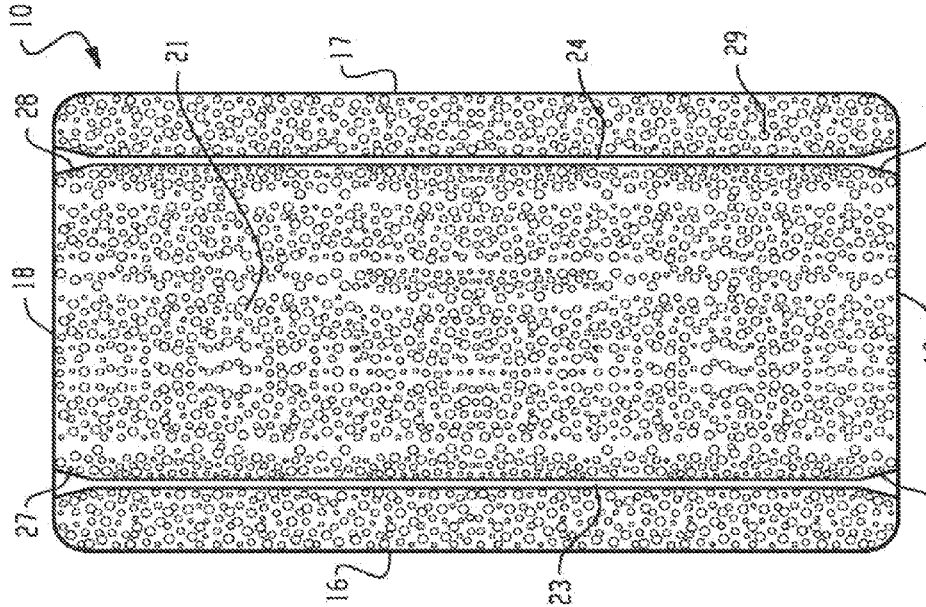
FIG. 2 is a back view of the example mobile device.

FIG. 2 shows the back face 21 of the example mobile device 10. The pair of longitudinal sides 16, 17 and the pair of latitudinal sides are coupled to the front face 11 and back face 21. The back face 21 in this example is covered with a high-friction elastomeric layer 29. Two recessed slots 23 and 24 are defined in the back face and are not covered with the high-friction elastomeric layer 29. The back face 21 need not be completely covered with an elastomeric layer 29. For example, coverage of 30% or more, 50% or more, 75% or more, or 90% or more may be acceptable to prevent sliding.

The elastomeric layer should have a high coefficient of friction to provide a surface that will resist sliding on even a low-friction surface. The elastomeric layer should also have a softness sufficient to provide some enhancement of impact resistance. Example elastomers that may satisfy these properties include elastomers generally classified as rubbers, specific elastomers include, but are not limited to, poly(styrene-butadiene), polyisoprene, polyisobutylene, natural rubber, polybutadiene, silicone rubber, nitrile rubber, polychloroprene, and ethylene-propylene diene.

The recessed slots 23, 24 run parallel to each other along the longitudinal length of the back face 21 of the mobile device 10. Each recessed slot 23, 24 defines a tapered opening 25, 26 at the bottom latitudinal side 19 and a tapered opening 27, 28 at the top latitudinal side 18. The tapered openings 25, 26 have a width that tapers from larger to smaller as the recessed slots 23, 24 extend longitudinally away from an open end at the bottom latitudinal side 19. Similarly, the tapered openings 27, 29 have a width that tapers from larger to smaller as the recessed slots 23, 24 extend longitudinally away from an open end at the top latitudinal side 19. This configuration allows a corresponding rail (provided on a holster, which will be described in further detail below) to be inserted into the recessed slots 23, 24 from either the top latitudinal side 18 or the bottom latitudinal side 19. A single slot or multiple slots, such as three or four may alternatively be used in conjunction with a single rail or multiple rails, such as three or four. By placing the slots 23, 24 on the back face 21, the longitudinal sides 16, 17 are unobstructed and available for buttons, interfaces, and other components.

FIG. 2A shows a cut-away view of the example mobile device 10. The elastomeric layer 29 overlays a rigid material 31, such as plastic, which forms the mobile device 10 case or housing. The recessed slots 23, 24 are composed of the rigid material 31, which is a low-friction material that allows for a corresponding rail to readily slide within the slot. The rigid material 31 that composes the recessed slots 23, 24 protrudes to the exterior surface of the back face 21. This feature may protect the elastomeric layer 29 from excessive wear against the rail.

FIG. 2B also shows a cut-away view of the example mobile device 10, but with a variation on the shape of the recessed slots 23, 24. In this example, the recessed slots each define an undercut 34, 35 that forms an L-shaped cross-section in the rigid material 31 case. This undercut 34, 35 provides a surface to retain a corresponding rail from being pulled away from the back face 21 of the mobile device 10, as further described below.

FIG. 3 shows a side view of the example mobile device 10. In this embodiment, the elastomeric layer extends more than 50% onto the longitudinal sides 16, 17. This embodiment provides an enhanced grip for the user, because a user's hand will typically apply pressure to the longitudinal sides 16, 17 to firmly hold the mobile device 10. In variations, the elastomeric layer may extend 60% to 100%, 80% to 100%, or 90 to 100%, onto the longitudinal sides 16, 17.

FIG. 4 shows a back face 51 of a second example mobile device 40. In this second example mobile device 40, the front face and longitudinal sides are the same as in FIGS. 1 and 3. The back face 51 in this example is also covered with a high-friction elastomeric layer 59. Two recessed slots 53, 54 are defined in the back face 51 and are not covered with the high-friction elastomeric layer. However, in the second example mobile device 40, the recessed slots 53, 54 run parallel to each other, but only partially extend along the longitudinal length of the back face 51 of the mobile device 40. The recessed slots 53, 54 may, for example, run between 50% to 99% of the longitudinal length of the back face 51, such as 60 to 95%, 70 to 95% or 80 to 95%. Each recessed slot 53, 54 defines a tapered opening 55, 56 at a bottom latitudinal side 49. In other examples, the slots 53, 54 could have tapered openings at a top latitudinal side 48.

This one-sided opening configuration allows rails to be inserted into the recessed slots 53, 54 from one of the top or bottom latitudinal sides 48, 49. This feature requires the second example mobile device 40 to be oriented in a certain direction to be properly placed in a corresponding holster, as described in further detail below. This configuration also allows for some expanded volume in the internal cavity of the mobile device 40 in place of the recessed grooves. However, it is appreciated that a single slot or three or more slots may also be appropriate, depending on the application.

Figure 5A:
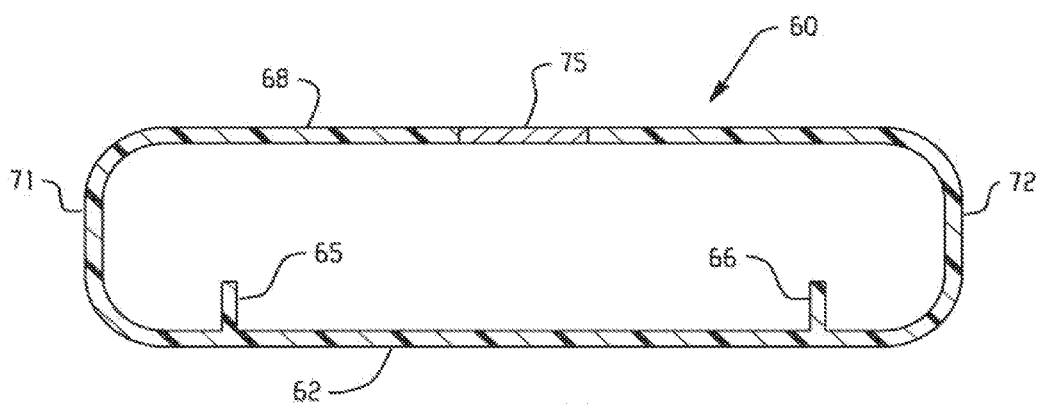
FIG. 5A is a cross-sectional view of the example mobile device holster.

FIGS. 5 and 5A show an example holster 60. The holster 60 defines a pocket for a mobile device, and has a back side 62 that includes two raised rails 65, 66 that run longitudinally in parallel along the holster's back side 62. A front side 68 of the holster 60 is opposite the back side 62, and first and second lateral sides 71, 72 are coupled to the back side 62 and front side 68. The front side 68, back side 62, and first and second lateral sides 71, 72 are collectively referred to as interior sides. A bottom side 74 is circumscribed by the back side 62, the front side 68 and the first and second lateral sides 71, 72. The holster 60 is open at the top and dimensionally configured to receive a mobile device, such as the example mobile device 10. The holster may be composed of a rigid material such as plastic, although other materials with similar properties may be appropriate.

The rails 65, 66 on the example holster 60 are composed of a low-friction material such as metal or plastic. A low-friction fabric coating such as felt may also be used to cover the rigid rails 65, 66, although it is appreciated that other low friction materials may be suitable. The rails 65, 66 are configured to slidably engage the recessed slots 23, 24 of the example mobile device 10 and have a height greater than the depth of the slots 23, 24. This configuration enables the rails 65, 66 to push against the bottom of the slots 23, 24 and provide separation between the back face 21 of the example mobile device 10 and the back side 62 of the example holster 60. The rails 65, 66 run the entire length or nearly the entire length of the holster 60.

In other embodiments, the rails 65, 66 need not run the entire length of the back side 62 (not shown). For example, a holster configured to receive the second example mobile device 40 would have rails 65, 66 that begin at or near the bottom side 74 of the holster 60 but only continue partially along the longitudinal length of the back side 62 so as to match the length of the shorter recessed slots 53, 54 of the second example mobile device 40. For example, the rails 65, 66 may extend 50% to 99% of the longitudinal length of the back side 62, such as 60 to 95%, 70 to 95%, or 80 to 95%.

A magnet 75 is disposed in the front side 68 of the example holster 60, and functions to interact with the mobile device when it is inserted into the holster 60. For example, to conserve battery power, the magnet 75 may signal the mobile device to shut down or sleep when in the holster 60.

The magnet 75 could be placed in an off-center location of the holster 60 (not shown). The off-center location could be offset from the center of the holster 60 in one dimension or two. In either case, the off-center magnet 75 would interact with the example mobile device 10 differently depending on which direction the example mobile device 10 is inserted. For example, inserting the example mobile device 10 with the bottom latitudinal side 19 facing the bottom side of the holster 60 could be configured to cause the example mobile device 10 to go into a sleep mode, (e.g. locking the keys 14 of the mobile device 10 and shutting off the display screen 12). Alternatively, inserting the example mobile device 10 with the top latitudinal side 18 facing the bottom side of the holster 60 (i.e. upside-down), could be configured to shut off the mobile device 10. In the case of the second example mobile device 40, which can only be inserted into the holster 60 in one direction, the magnet would only have one function, e.g. to cause the second mobile device 40 to sleep or shut-off.

The magnet 75 could also be placed in a central location that would cause the example mobile device 10 to sleep or shut-off, regardless of its orientation in the holster 60. For example, the central location as shown in FIGS. 5-5B and 7-7A.

Figure 5B:
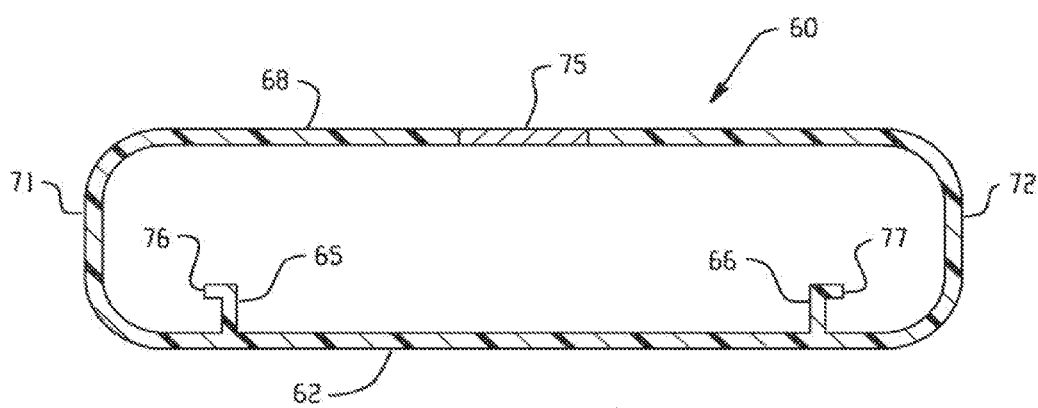
FIG. 5B is a cross-sectional view of the example mobile device holster with L-shaped recessed slots.

FIG. 5B shows a cut-away view of the example holster 60, but with a variation on the shape of the rails 65, 66. In this example, the rails 65, 66 each have a lip 76, 77, forming an L-shaped cross-section. The lips 76, 77 are configured to fit within the undercuts 34, 35 on the variation of the example mobile device 10 discussed above (shown in FIG. 2B). Once the rails 65, 66 are inserted into the L-shaped slots 23, 24, the undercuts 34, 35 on the slots 23, 24 will provide a surface to retain the lips 76, 77 of the rails 65, 66 and provide a more secure fit in the holster 60.

A T-shaped cross-section for both rails 65, 66 and recessed slots 23, 24 is another option, although it is appreciated that additional configurations for the rails and corresponding slots may also be appropriate.

Figure 6:
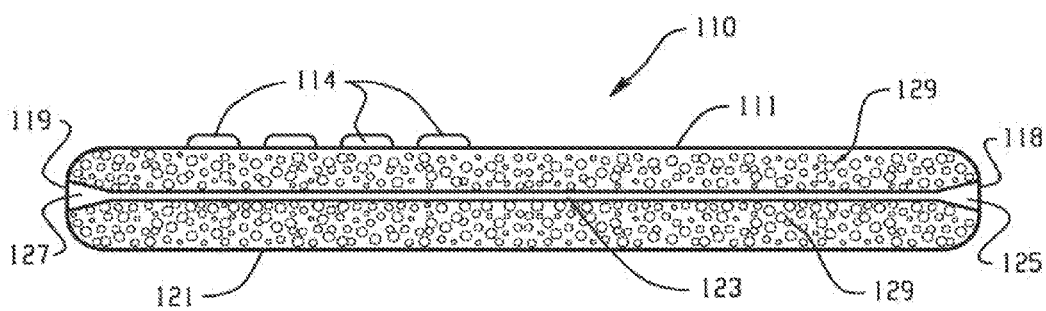
FIG. 6 is a side view of a third example mobile device.
Figure 6A:
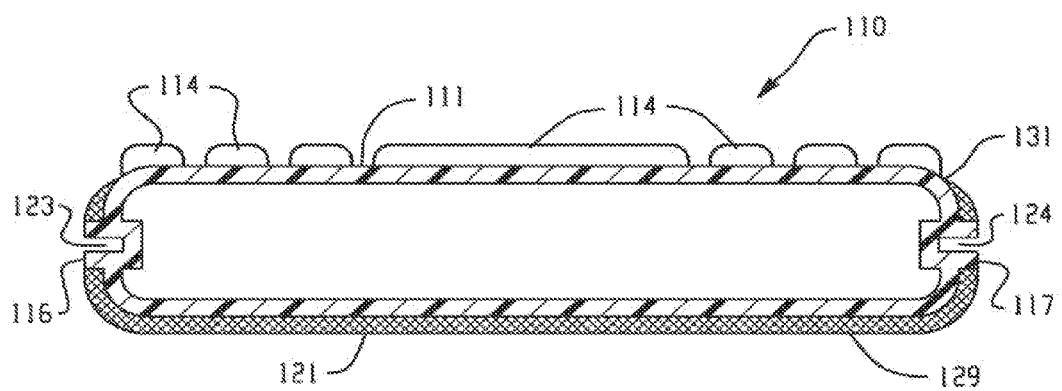
FIG. 6A is a cross-sectional view of a third example mobile device.

FIGS. 6 and 6A show a third example mobile device 110 that is the same as the first example mobile device 10, except it has recessed slots 123, 124 with tapered openings 125, 127 disposed on the longitudinal sides 116, 117, instead of the back face 121. In addition, the elastomeric layer 129 of the device 110 is configured differently. Specifically, the elastomeric layer 129 covers the back face 121 and the longitudinal sides 116, 117, up to the recessed slots 123, 124, and continues onto the other side of the recessed slots 123, 124. This embodiment may allow the mobile device 110 to be thinner than the examples where the recessed rails are disposed in the back face 121. It also allows the back face to be free of the obstruction of the slots, so that components such as battery doors, keys, secondary displays, electronic interfaces, speakers, or microphones may be disposed on the back face 121.

In an alternative example, the third example mobile device 110 can have recessed slots 123, 124 that partially extend along the longitudinal length of the longitudinal sides 116, 117 of the mobile device 110 and are open at one latitudinal side 118 or 119. The recessed slots 123, 124 may run between 50% to 99% of the longitudinal length of the longitudinal sides 116, 117, such as 60 to 95%, 70 to 95% or 80 to 95%. It may be preferable to limit the length of the recessed slots 123, 124 to allow room for buttons or other components on the longitudinal sides 116, 117 of the example mobile device 110. This configuration also allows for some expanded volume in the internal cavity of the third example mobile device 110 in place of the recessed slots 123, 124. When the recessed slots 123, 124 are used in conjunction with other components on the longitudinal sides 116, 117, it may be preferable to limit the length of the recessed slots to 50 to 75% of the length of the longitudinal sides 116, 117, such as 51% to 70%, or 55% to 65%.

As discussed above, the partially extending, one-sided opening configuration allows a rail to be inserted into the recessed slots 123, 124 from only one latitudinal side 118 or 119. This feature requires the third example mobile device 110 to be oriented in a certain direction when placed in a holster.

Figure 7:
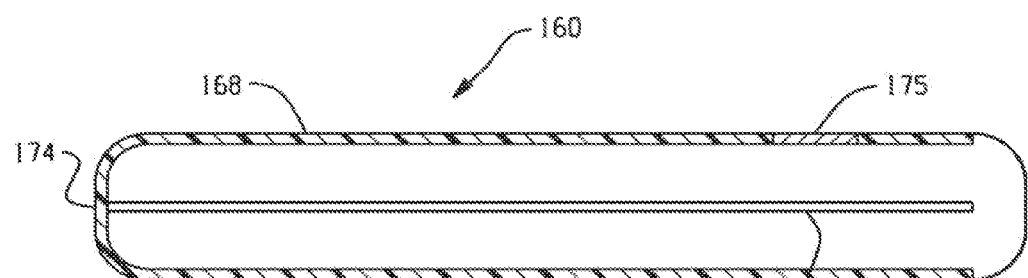
FIG. 7 is a side cross-sectional view of a second example mobile device holster.
Figure 7A:
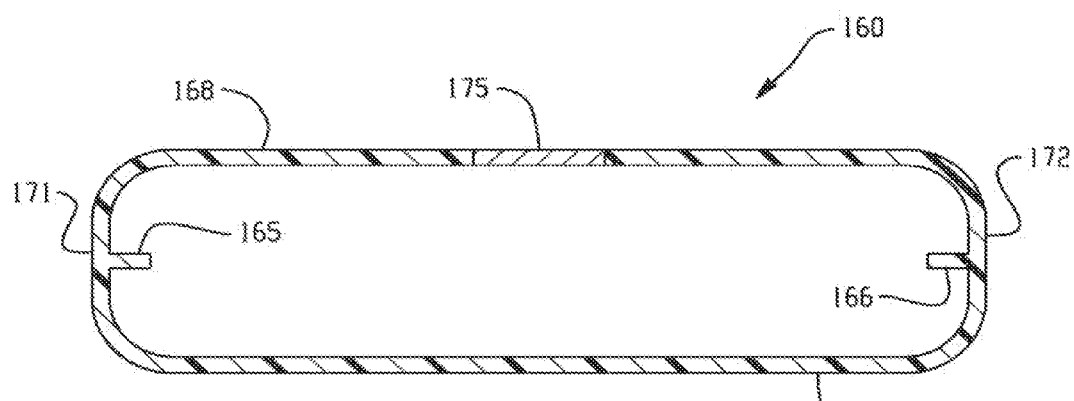
FIG. 7A is a cross-sectional view of the second example mobile device holster.

FIGS. 7 and 7A depict a second example holster 160 that is the same as the example holster 60 discussed above, except the rails 165, 166 are disposed on the first and second lateral sides 171, 172 instead of the back side 162. The front side 168, back side 162, and first and second lateral sides 171, 172 are collectively referred to as interior sides. The rails 165, 166 should be of sufficient height so that they are taller than the depth of the recessed slots 123, 124 of the third example mobile device 110. Such a configuration enables the rails 165, 166 to provide separation between the longitudinal sides 116, 117 of the third example mobile device 110 and the first and second lateral sides 171, 172 of the second example holster 160. In the depicted example, the rails 165, 166 run the entire length or nearly the entire length of the second example holster 160. However, alternatively, the rails 165, 166 may run only partially along the longitudinal length of the first and second lateral sides 171, 172 (not shown). The rails 165, 166 should correspond to the length of the recessed slots 123, 124 of the mobile device with which the holster 160 is configured to be paired.

Optionally, the rails 165, 166 of the second example holster 160 may have an L-shaped cross-section as described above with regard to the example holster 60. In conjunction, the third example mobile device 110 may have recessed slots with L-shaped cross-sections. A T-shaped cross-section for both rails 165, 166 and recessed slots 123, 124 is another option. However, it is to be understood that additional slot and rail configurations may be suitable.

Figure 8:
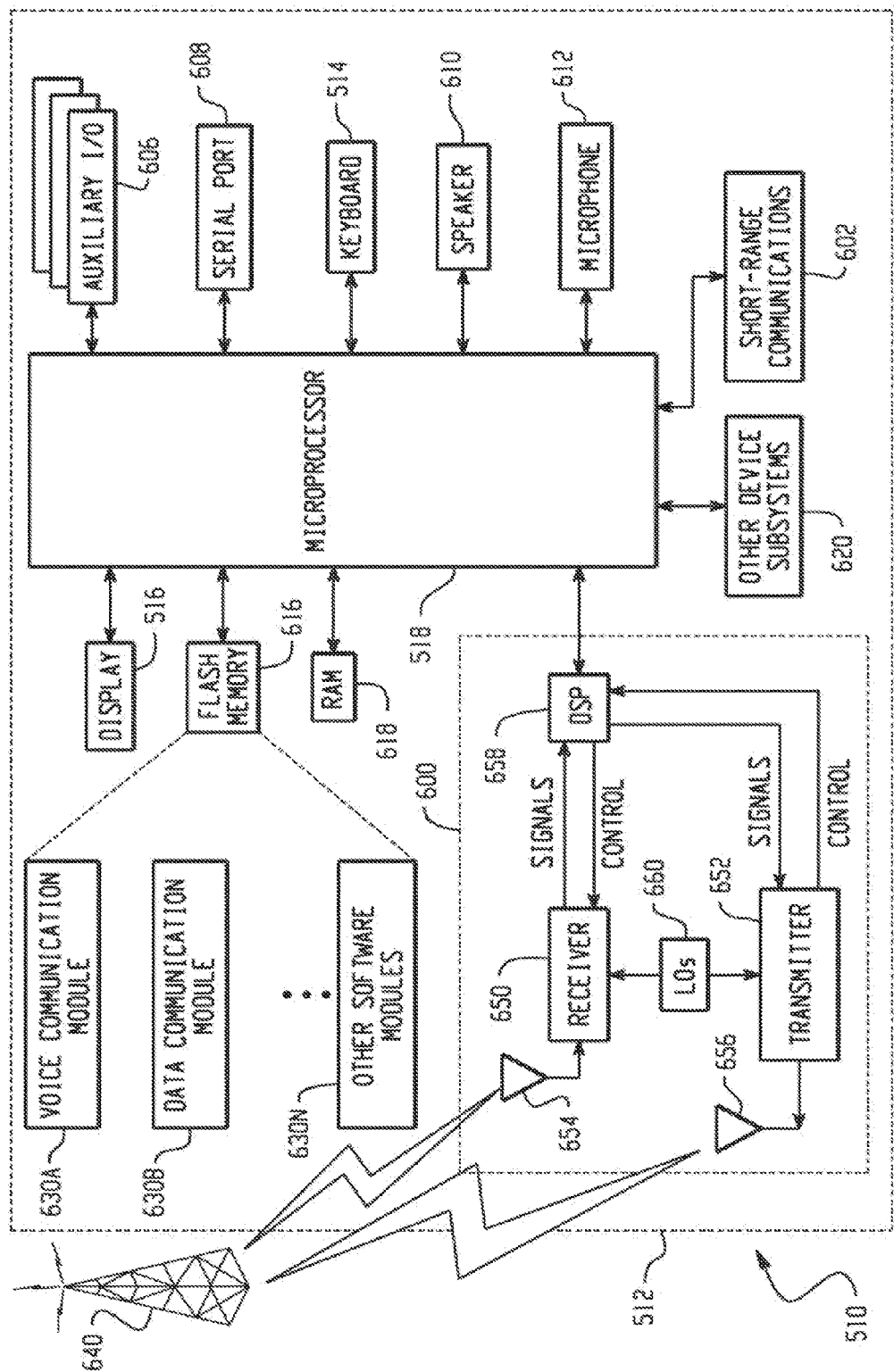
FIG. 8 is a schematic diagram of an example mobile device.

The example mobile devices (generally referred to herein as 510) disclosed herein include common features that are shown schematically in FIG. 8. A display 516 is preferably a full graphic LCD, although other types of output devices may alternatively be utilized. A processing device 518, which is shown schematically in FIG. 8, is contained within a housing 512 and is coupled between a keyboard 514 and the display 516. The processing device 518 controls the operation of the display 516, as well as the overall operation of the mobile communication device 510, in response to actuation of keys on the keyboard 514 by the user.

The housing 512 may be elongated vertically, or may take on other sizes and shapes, including a clamshell housing structure, among other structures. The keyboard may include a mode selection key, or other hardware or software for switching between text entry and telephony entry.

In addition to the processing device 518, other parts of the mobile communication device 510 are shown schematically in FIG. 8. These include a communications subsystem 600; a short-range communications subsystem 602; the keyboard 514 and the display 516, along with other input/output devices 606, 608, 610, and 612; memory devices 616, 618; and various other device subsystems 620. The mobile communication device 510 is preferably a two-way RF communication device having voice and data communication capabilities. In addition, the mobile communication device 510 preferably has the capability to communicate with other computer systems via the Internet.

Operating system software executed by the processing device 518 is preferably stored in a persistent store, such as a flash memory 616, but may be stored in other types of memory devices, such as a read only memory (ROM) or similar storage element. In addition, system software, specific device applications, or parts thereof, may be temporarily loaded into a volatile store, such as a random access memory (RAM) 618. Communication signals received by the mobile communication device may also be stored to the RAM 618.

The processing device 518, in addition to its operating system functions, enables execution of software applications 630A-630N on the device 510. A predetermined set of applications that control basic device operations, such as data and voice communications 630A and 630B, may be installed on the device 510 during manufacture. In addition, a personal information manager (PIM) application may be installed during manufacture. The PIM is preferably capable of organizing and managing data items, such as e-mail, calendar events, voice mails, appointments, and task items. The PIM application is also preferably capable of sending and receiving data items via a wireless network 640. Preferably, the PIM data items are seamlessly integrated, synchronized and updated via the wireless network 640 with the device user's corresponding data items stored or associated with a host computer system. An example system and method for accomplishing these steps is disclosed in "System And Method For Pushing Information From A Host System To A Mobile Device Having A Shared Electronic Address," U.S. Pat. No. 6,219,694, which is owned by the assignee of the present application and incorporated herein by reference.

Communication functions, including data and voice communications, are performed through the communication subsystem 600, and possibly through the short-range communications subsystem 602. The communication subsystem 600 includes a receiver 650, a transmitter 652, and one or more antennas 654, 656. In addition, the communication subsystem 600 also includes a processing module, such as a digital signal processor (DSP) 658, and local oscillators (LOs) 660. The specific design and implementation of the communication subsystem 600 is dependent upon the communication network in which the mobile communication device 510 is intended to operate. For example, a mobile communication device 510 may include a communication subsystem 600 designed to operate with the Mobitex™, Data TAC™ or General Packet Radio Service (GPRS) mobile data communication networks and also designed to operate with any of a variety of voice communication networks, such as AMPS, TDMA, CDMA, PCS, GSM, etc. Other types of data and voice networks, both separate and integrated, may also be utilized with the mobile communication device 510.

Network access requirements vary depending upon the type of communication system. For example, in the Mobitex and DataTAC networks, mobile devices are registered on the network using a unique personal identification number or PIN associated with each device. In GPRS networks, however, network access is associated with a subscriber or user of a device. A GPRS device therefore requires a subscriber identity module, commonly referred to as a SIM card (not shown), in order to operate on a GPRS network.

When required network registration or activation procedures have been completed, the mobile communication device 510 may send and receive communication signals over the wireless network 640. Signals received from the network 640 by the antenna 654 are routed to the receiver 650, which provides for signal amplification, frequency down conversion, filtering, channel selection, etc., and may also provide analog to digital conversion. Analog-to-digital conversion of the received signal allows the DSP 658 to perform more complex communication functions, such as demodulation and decoding. In a similar manner, signals to be transmitted to the network 640 are processed (e.g. modulated and encoded) by the DSP 658 and are then provided to the transmitter 652 for digital to analog conversion, frequency up conversion, filtering, amplification and transmission to the network 640 (or networks) via the antenna 656.

In addition to processing communication signals, the DSP 658 provides for control of the receiver 650 and the transmitter 652. For example, gains applied to communication signals in the receiver 650 and transmitter 652 may be adaptively controlled through automatic gain control algorithms implemented in the DSP 658.

In a data communication mode, a received signal, such as a text message or web page download, is processed by the communication subsystem 600 and is input to the processing device 518. The received signal is then further processed by the processing device 518 for an output to the display 516, or alternatively to some other auxiliary I/O device 606. A device user may also compose data items, such as e-mail messages, using the keyboard 514 and/or some other auxiliary I/O device 606, such as a trackball, a touchpad, a rocker switch, a thumb-wheel, or some other type of input device. The composed data items may then be transmitted over the network 640 via the communication subsystem 600.

In a voice communication mode, overall operation of the device is substantially similar to the data communication mode, except that received signals are output to a speaker 610, and signals for transmission are generated by a microphone 612. Alternative voice or audio I/O subsystems, such as a voice message recording subsystem, may also be implemented on the device 510. In addition, the display 516 may also be utilized in voice communication mode, for example to display the identity of a calling party, the duration of a voice call, or other voice call related information.

The short-range communications subsystem 602 enables communication between the mobile communication device 510 and other proximate systems or devices, which need not necessarily be similar devices. For example, the short-range communications subsystem 602 may include an infrared device and associated circuits and components, or a Bluetooth™ communication module to provide for communication with similarly-enabled systems and devices.

While various features of the claimed elastomeric back with rails for a mobile device are presented above, it should be understood that the features may be used singly or in any combination thereof. Therefore, the claims are not to be limited to only the specific examples depicted herein. The scope of the disclosure is accordingly defined as set forth in the appended claims.

For example, a variation on the examples described herein may include a locking mechanism on the rails that interacts with the groove to hold the mobile device in place.

It should be understood that the terms longitude and latitude as used herein are to be interpreted as mutually comparative terms, not as designating an absolute direction. For example, a longitudinal side could also be called a latitudinal side if the latitudinal side of the same device is correspondingly considered a longitudinal side. It should also be understood that the term "a" or "an" is used to mean "one or more" unless otherwise indicated.

The invention claimed is:

1. A system comprising:
   a handheld device comprising a first side defining a first longitudinal slot having an open end and a second side opposite the first side and defining a second longitudinal slot having an open end; said first and second sides comprising surfaces formed of a slide resistant material having a high coefficient of friction disposed about the slots; each of said slots having a depth and being formed of a material having a low coefficient of friction, and
   a receiving structure defining a pocket for receiving the handheld device and having an opening, said receiving structure comprising opposite rails extending from the opening, each rail being disposed to slidingly engage one of said slots through the open end thereof,
   each rail being formed of a material having a low coefficient of friction to facilitate sliding within said slot and having a height greater than the depth of the slot by a distance sufficient to space the side apart from the receiving structure.

2. The system of claim 1 wherein the receiving structure comprises side walls disposed to be adjacent the first and second sides of the handheld device, and wherein the rails are affixed to the walls and project into the pocket.

3. The system of claim 1 wherein each slot has a bottom surface that is adapted to contact the respective rail to space the respective side of the device away from an adjacent side wall of the pocket.

4. The system of claim 1 wherein the handheld device includes a back face having a slide resistant material having a high coefficient of friction, and wherein the pocket includes a back wall configured to face the device's back face when the device is received by the receiving structure and to be spaced apart therefrom when the rails are received in the slots.

5. The system of claim 1 wherein the handheld device has front and rear surfaces and top and bottom surfaces, and further has two opposite side surfaces that are at the first and second sides and that extend in a longitudinal direction from the top surface to the bottom surface and in a lateral direction from the front surface to the rear surface.

6. The system of claim 5 wherein the slots extend in the longitudinal direction and are recessed laterally inward respectively from the two side surfaces.

7. The system of claim 6 wherein each open end is at the bottom surface of the device for the respective rail to enter the slot through the open end.

8. The system of claim 6 wherein each open end is a bottom open end, and the device further includes, for each slot, a top open end at the top surface of the device for the respective rail to enter the slot through the top open end, thereby enabling the device to be inserted into the pocket in either of two opposite orientations.

9. The system of claim 1 wherein the device is configured to automatically perform a function when received in the pocket.

10. The system of claim 9 wherein the function is to go into sleep mode.

11. The system of claim 9 wherein the function is to shut down.

12. The system of claim 1 wherein the device is configured to automatically perform a first function when received in the pocket in a first orientation and to automatically perform a different second function when received in the pocket in an opposite second orientation.

13. The system of claim 12 wherein the first function is to go into a sleep mode, and the second function is to shut down.

14. The system of claim 12 wherein the receiving structure includes a magnet configured to interact with the device differently depending on the orientation of the device to selectively trigger the first function or the second function.

15. A system comprising:
a handheld device that includes:
opposite side surfaces spaced apart in a lateral direction and formed of a high-friction slide resistant material for resisting sliding when grasped, each said side surface defining a slot formed of a material having lower friction than the slide resistant surface section;
a receptacle that includes:
a pocket having an opening and opposite pocket sides extending from the opening, each said side comprising a rail projecting into the pocket and configured to be slidingly received by one of said slots to guide the device as the device is moved through the top opening into a received position in the pocket and having a height sufficient to keep the slide resistant material spaced away from the adjacent pocket side as the device is moved into the received position.

16. The system of claim 15 wherein the device is configured to be inserted into the structure in either of two opposite orientations with the rails slidingly received by the slots in either orientation, and wherein the device is further configured to automatically perform a first function when received in the pocket in one of the orientations and to automatically perform a different second function when received in the pocket in the other orientation.

17. The system of claim 16 wherein the first function is to go into a sleep mode, and the second function is to shut down.

18. The system of claim 15 wherein the handheld device includes a back between the side surfaces and wherein the back includes the high-friction slide resistant material.

19. The system of claim 15 wherein the receptacle includes a magnet configured to interact with the device differently depending on the orientation of the device to selectively trigger the first function or the second function.

* * * * *